United States Patent [19]

Nakagawa et al.

[11] Patent Number: 5,805,417

[45] Date of Patent: Sep. 8, 1998

[54] HEAT DISSIPATION STRUCTURE IN A PORTABLE COMPUTER INCLUDING A HEAT DISSIPATION BLOCK EXTENDING FROM A HEAT DISSIPATION PLATE THROUGH A FIRST CIRCUIT BOARD TO A CPU ON A SECOND CIRCUIT BOARD

[75] Inventors: Tsuyoshi Nakagawa, Hadano; Yasushi Neho, Ebina; Naoyuki Sakamoto, Yokohama; Shigeo Ohashi, Tsuchiura; Yoshito Ohmura, Owariasahi; Yukiko Iwama, Kokubunji; Tadakatsu Nakajima; Yoshihiro Kondo, both of Ibaraki-ken; Susumu Iwai, Hadano; Hitoshi Matsushima, Ryugasaki, all of Japan

[73] Assignee: Hitachi, Ltd., Tokyo, Japan

[21] Appl. No.: 728,171

[22] Filed: Oct. 9, 1996

[30] Foreign Application Priority Data

Oct. 13, 1995 [JP] Japan .................................. 7-265148
Oct. 20, 1995 [JP] Japan .................................. 7-272173

[51] Int. Cl.$^6$ ................................ G06F 1/20; H05K 7/20
[52] U.S. Cl. ............................................ 361/687; 361/704
[58] Field of Search .................................... 361/687, 704, 361/705, 707; 174/252

[56] References Cited

U.S. PATENT DOCUMENTS 5,557,500  9/1996  Baucom et al. ........................ 361/687

Primary Examiner—Michael W. Phillips
Attorney, Agent, or Firm—Antonelli, Terry, Stout & Kraus, LLP

[57] ABSTRACT

A personal computer comprises a heat dissipation plate installed on a floor of its case, a motherboard disposed apart from the heat dissipation plate by a predetermined distance, and a daughter board disposed in such a manner that the motherboard is positioned between the heat dissipation plate and the daughter board. The daughter board is mounted with a central processing unit which generates heat. The motherboard is provided with a hole. A heat dissipation block extends from the heat dissipation plate through the hole in the motherboard, and is connected to the central processing unit through a heat conductive coupler. This forms a heat dissipation path which passes through the central processing unit, the heat dissipation block, the heat dissipation plate, and the case. In addition, another heat dissipation block is interposed between a keyboard and the daughter board so that another heat dissipation path can be formed through the central processing unit, another heat dissipation block, another heat dissipation plate, and the keyboard. A heat pipe may be connected to a heat dissipation plate.

14 Claims, 12 Drawing Sheets

F I G. 16
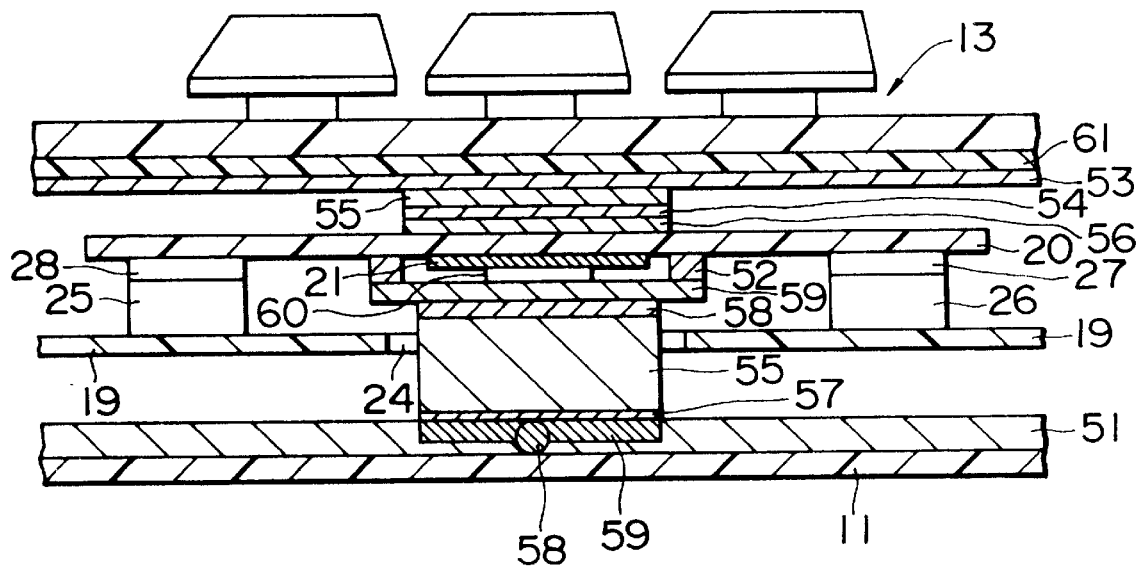

HEAT DISSIPATION STRUCTURE IN A PORTABLE COMPUTER INCLUDING A HEAT DISSIPATION BLOCK EXTENDING FROM A HEAT DISSIPATION PLATE THROUGH A FIRST CIRCUIT BOARD TO A CPU ON A SECOND CIRCUIT BOARD

BACKGROUND OF THE INVENTION

Field of the Invention and Description of Related Art

The present invention relates to a heat dissipation structure for electronic equipment mounted with current consuming devices.

Electronic equipment such as a personal computer or a word processing machine employs current consuming devices in its information processing section or power supply section. These devices consume current and locally generate heat in the equipment. The generated heat damages not only the devices themselves but also other elements of the equipment.

Thus, as described in JP-A-4-48797, JP-A-55-125699, JP-A-63-125699, JP-A-3-255697, and JP-U-5-29153, a metal plate is interposed between the device and a housing to dissipate heat generated by the device through the metal plate outside the housing.

Recently, a personal computer employs a dual board system to seek for a higher expandability, instead of a conventional single board system in which all elements are mounted on a single board. That is, many elements are mounted on a primary board or so-called motherboard, and a processing unit (MPU) is mounted on a separate secondary board or so-called daughter board. The daughter board is removably attached to the motherboard. Thus, the performance of the equipment can be easily enhanced by replacing the daughter board. However, since two boards are used, it is difficult to dissipate heat generated by the processing unit.

SUMMARY OF THE INVENTION

Object of the Invention and Summary of the Invention

The present invention is intended to provide a heat dissipation structure for electronic equipment using a dual board system, which can offer a sufficient heat dissipation effect.

To this end, the present invention provides a heat dissipation structure for electronic equipment comprising a first heat dissipation plate, a first board disposed apart from the first heat dissipation plate by a predetermined distance, a second board disposed in such a manner that the fist board is positioned between the first heat dissipation plate and the seocnd board and mounted with a current consuming device thereon, and a heat dissipation block assembly extending from the first heat dissipation plate through the first board and abutting a surface of the device on the second board.

BRIEF DESCRIPTION OF THE DRAWINGS

FIG. 16 is a fragmentary sectional view showing a variation of the embodiment of FIG. 13.

DETAILED DESCRIPTION OF THE PREFERRED EMBODIMENTS

Figure 1:
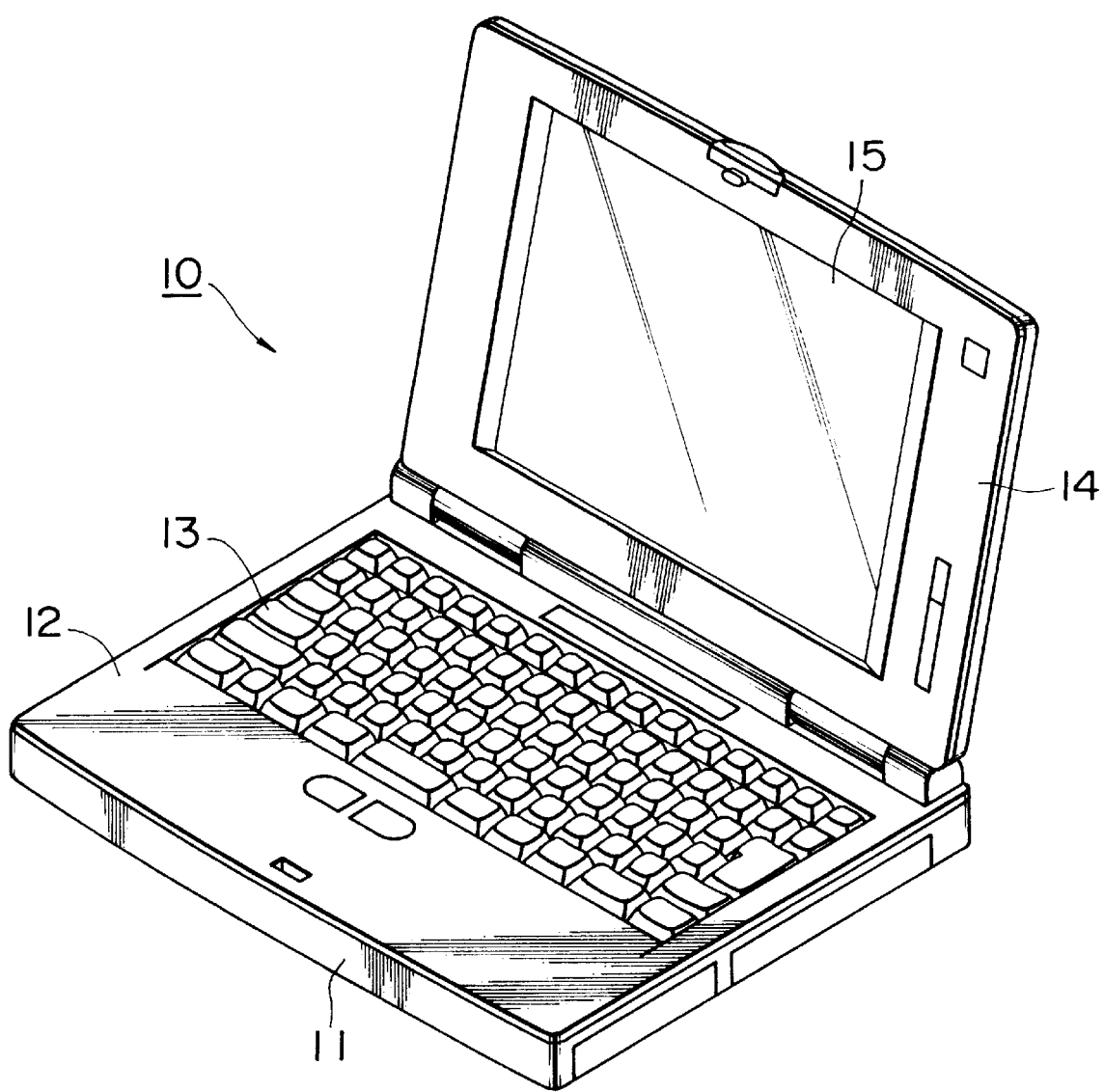
FIG. 1 is a perspective view showing a personal computer to which a heat dissipation structure according to the present invention is applied.

Referring to FIG. 1, a personal computer 10 comprises a molded resin bottomed case 11, a top cover 12 for covering the bottomed case 11, a keyboard 13, a cover 14 tiltably held by the bottomed case 11, and an LCD panel 15 mounted on the cover 14.

Figure 2:
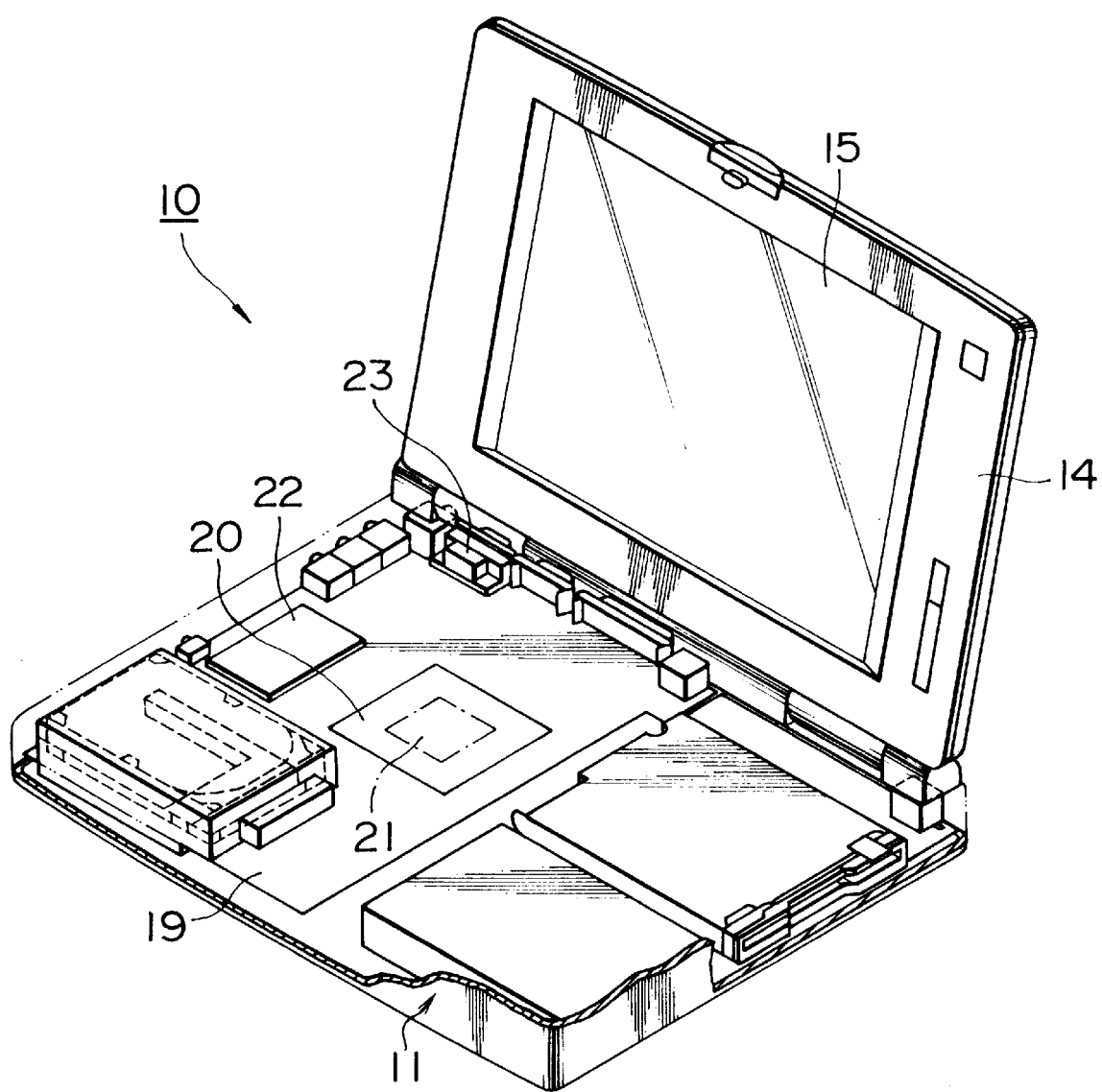
FIG. 2 is a perspective view showing the inside of the personal computer of FIG. 1.

As shown in FIG. 2, the bottomed case 11 contains a motherboard 19 therein. A daughter board 20 on which a central processing unit (CPU) 21 is mounted is coupled and mounted onto the motherboard 19 through a connector described later. The motherboard 19 also has a memory module 22 and a connector 23 mounted thereon.

Figure 3:
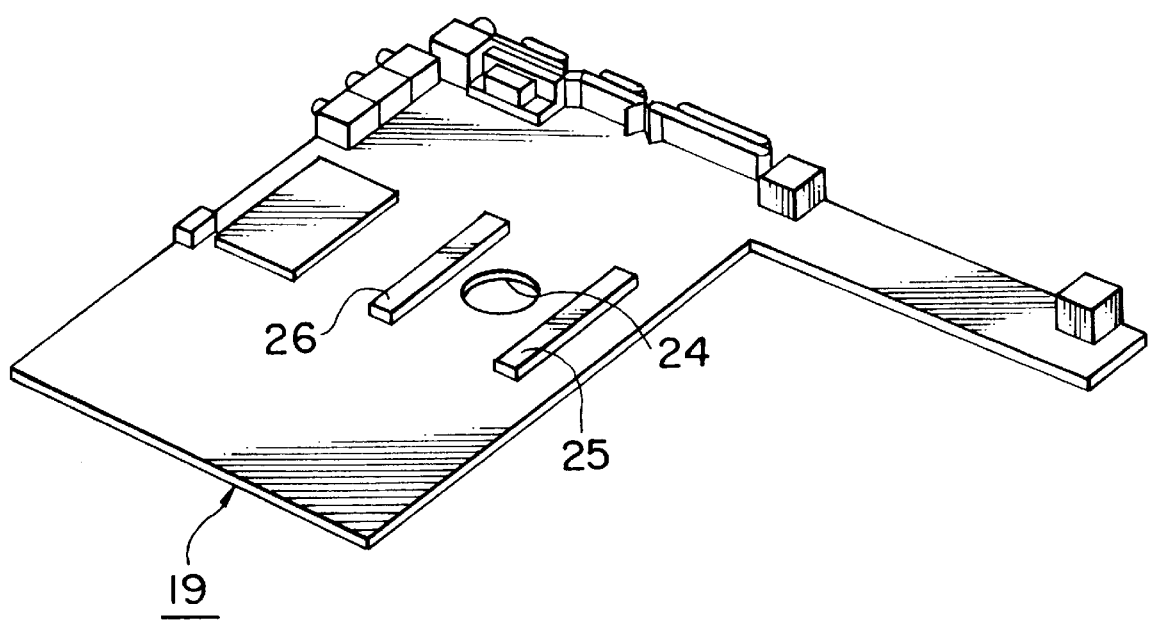
FIG. 3 is a perspective view showing a motherboard shown in FIG. 2.

As shown in FIG. 3, the motherboard 19 is formed with a circular through hole 24 at a portion thereof facing to the daughter board 20. Two connectors 25 and 26 are fixedly soldered adjacent the hole 24.

Figure 4A:
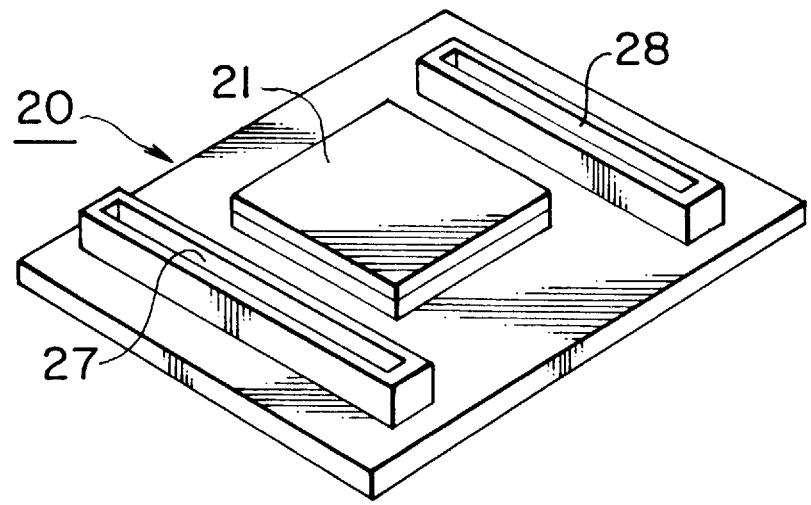
FIGS. 4A and 4B are perspective views showing a daughter board shown in FIG. 2, respectively.
Figure 4B:
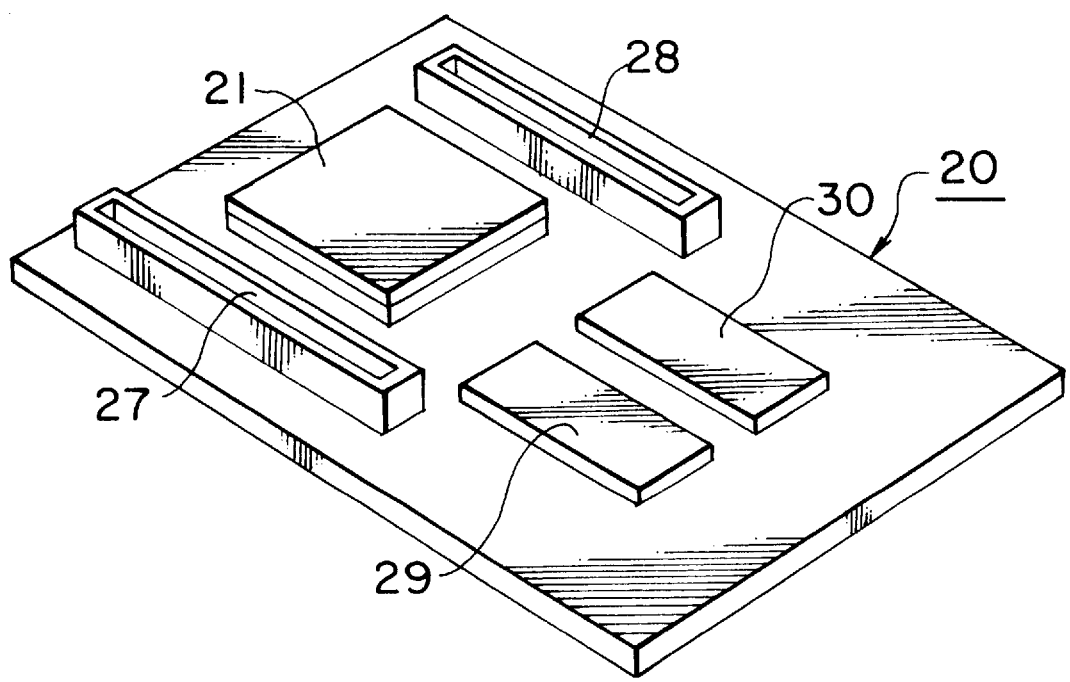

The daughter board 20 is mounted with only the central processing unit 21 as shown in FIG. 4A, or the central processing unit 21 and cache memories 29, 30 as shown in FIG. 4B. The daughter board 20 has connectors 27 and 28 fixed thereon. The connectors 24 and 25 of the motherboard 19 are mated to the connectors 27 and 28 of the daughter board 20 to couple the motherboard 19 and the daughter board 20, and to electrically connect the elements on both boards together.

Figure 5:
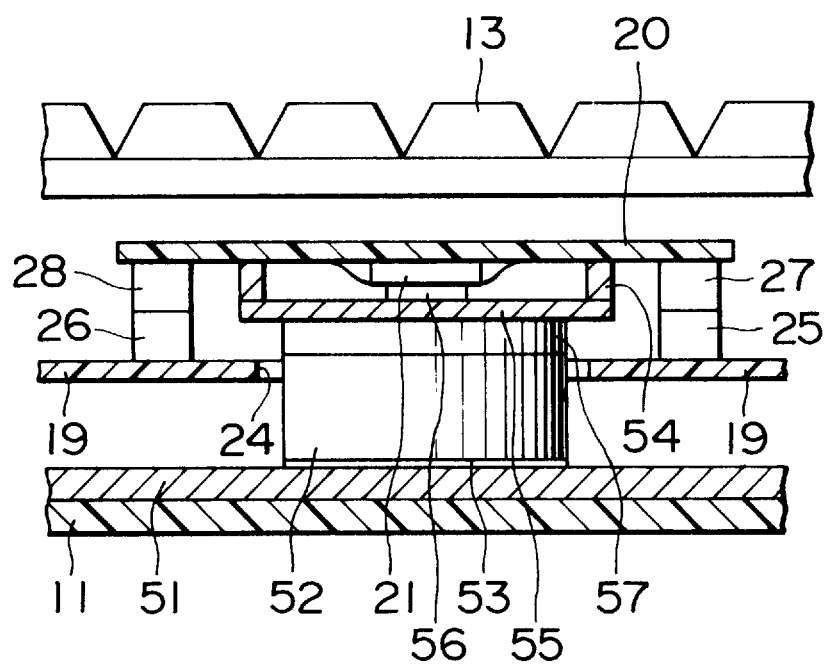
FIGS. 5 to 12 are fragmentary sectional views each showing the heat dissipation structure according to one aspect of the present invention.

The heat dissipation structure of the present invention is explained hereinunder with referring to FIG. 5. A heat dissipation plate 51 made of a material with high heat conductivity such as aluminum or copper is installed on an inner floor of the bottomed case 11. The motherboard 19 is held so that it is separated from the heat dissipation plate 51 with a predetermined distance.

The daughter board 20 is positioned between the motherboard 19 and the keyboard 13 so that the central processing unit 21 is disposed between the daughter board 20 and the motherboard 19 when the connectors 25 and 26 are mated to the connectors 27 and 28.

A heat dissipation block 52 is mounted on the heat dissipation plate 51 integrally, or through an adhesive heat conductive tape 53. The heat dissipation block 52 extends from the heat dissipation plate 51 through the hole 24 formed in the motherboard 19.

The daughter board 20 is provided with an electrically insulating frame 54 surrounding the central processing unit 21. The frame 54 supports a metal plate 55. A flexible heat conductive coupler 56 is interposed between the metal plate 55 and a surface of the central processing unit 21 in such a manner that the coupler 56 abuts them. Moreover, a flexible heat conductive coupler 57 is provided between the metal plate 55 and the heat dissipation block 52. These heat conductive couplers 56 and 57 are made of Si rubber containing aluminum oxide filler or of gel Si resin, for example.

Heat generated by the central processing unit 21 is dissipated outside of the case through the heat conductive coupler 56, the metal plate 55, the heat conductive coupler 57, the heat dissipation block 52, (the heat conductive tape 53), the heat dissipation plate 51, and the case 11.

Figure 6:
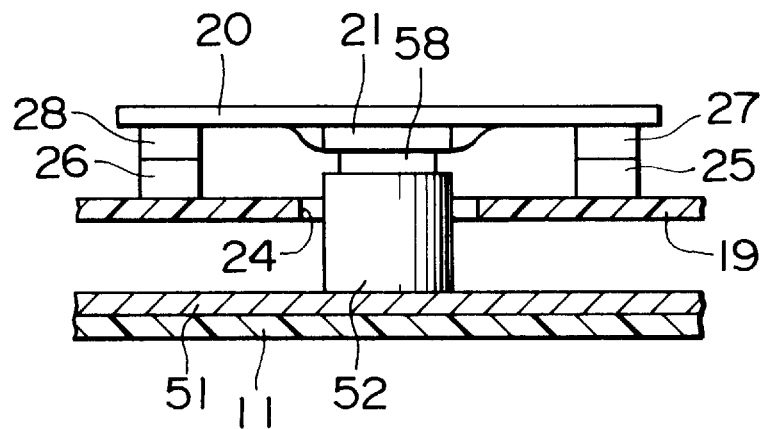

In the embodiment shown in FIG. 6, the central processing unit 21 is thermally connected to the heat dissipation block 52 only through the flexible heat conductive coupler 58. A cross-sectional area of the heat dissipation block 52 is larger than that of the coupler 58, so that heat of the central processing unit 21 radially outwardly dissipates and conducts to the heat dissipation plate 51.

Figure 7:
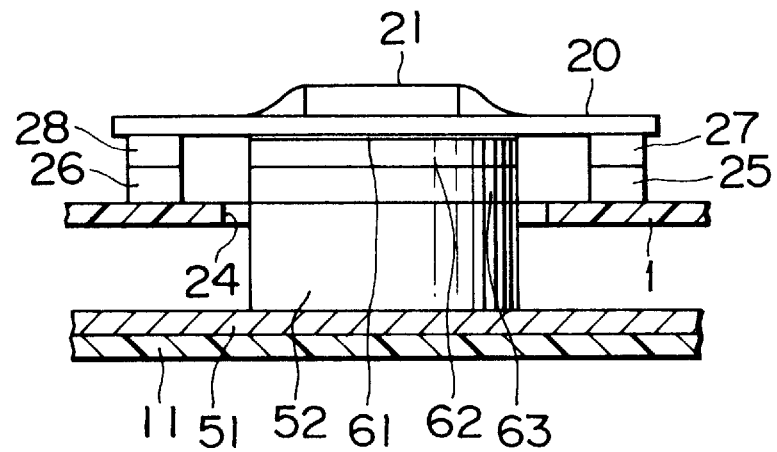

In the embodiment shown in FIG. 7, the central processing unit 21 is mounted on the daughter board 20 so that the central processing unit 21 is disposed between the daughter board 20 and the keyboard 13. A part of a surface of the daughter board 20 opposite to a surface thereof on which the central processing unit 21 is mounted, which part corresponds with the central processing unit 21, is called a "corresponding portion" of the daughter board 20 hereinunder. The corresponding portion and the heat dissipation block 52 are connected each other through an electrically insulating heat conductive sheet 61, a metal plate 62, and a flexible head conductive coupler 63.

Heat of the central processing unit 21 conducts to the metal plate 62 through the daughter board 20, and is diffused in a planar direction. In addition, after the heat conducts to the heat dissipation block 52, it is diffused in the heat dissipation plate 51 and dissipated outside through the case 11.

In the above embodiments, the heat dissipation is performed on one side of the central processing unit. On the contrary, in the following several embodiments, heat is dissipated at both sides of the central processing unit.

Figure 8:
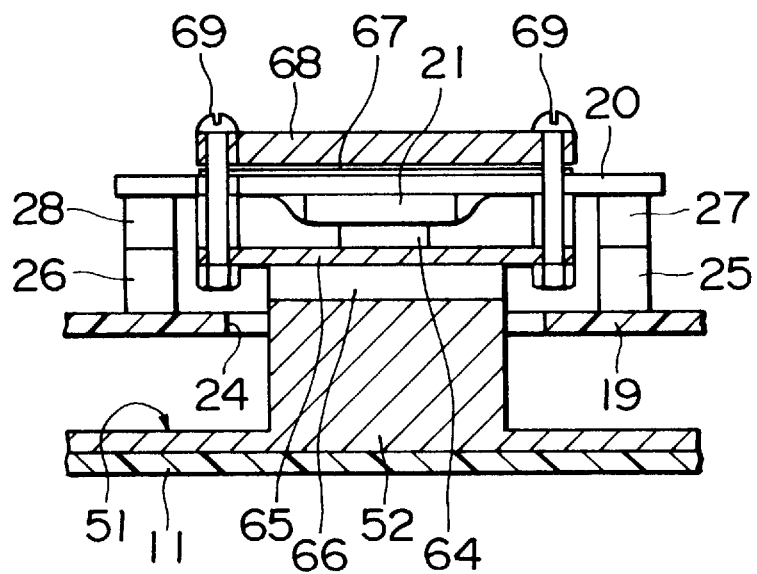

The heat dissipation structure of the present invention shown in FIG. 8 will be explained. A heat dissipation plate 51 made of a material with high heat conductivity such as aluminum or copper is installed on an inner floor of the bottomed case 11. The motherboard 19 is held so that it is separated from the heat dissipation plate 51 with a predetermined distance.

The daughter board 20 is mounted on the motherboard 19 by mating the connectors 25 and 26 to the connectors 27 and 28.

The heat dissipation block 52 is integral with the heat dissipation plate 51. The heat dissipation block 52 extends from the heat dissipation plate 51 through the hole 24 formed in the motherboard 19.

The central processing unit 21 on the daughter board 20 is thermally connected to the heat dissipation block 52 through a flexible heat conductive coupler 64, a metal plate 65, and a flexible heat conductive coupler 66. A metal plate 68 is thermally connected to the corresponding portion of the daughter board 20 through an electrically insulating heat conductive sheet 67. The metal plates 65 and 68 are clamped together by nuts and bolts or rods 69 which are made of metal with high heat conductivity such as aluminum or copper, and extend through the daughter board 20.

A part of heat generated by the central processing unit 21 conducts to the metal plate 68 through the daughter board 20 and the heat conductive sheet 67, and is dissipated in a planar direction in the metal plate 68. In addition, it conducts to the metal plate 65 through the bolts 69. Another part of the heat generated by the central processing unit 21 conducts to the metal plate 65 through the coupler 64. Thus, the heat generated by the central processing unit 21 is conducted to the heat dissipation block 52 from both sides of the central processing unit 21 through the metal plate 65 and the coupler 66.

Figure 9:
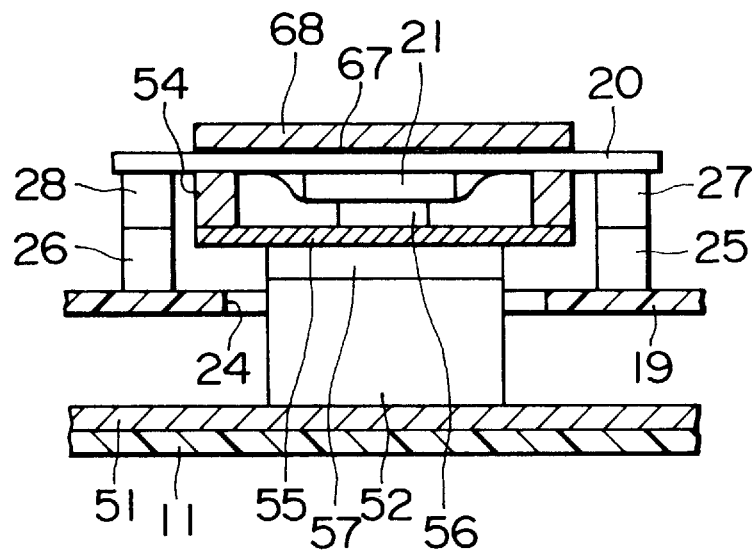

In the embodiment shown in FIG. 9, a metal frame 54 is fixed on the daughter board 20 by an electrically insulating double coated adhesive tape so as to surround the central processing unit 21. The frame 54 supports a metal plate 55. A flexible heat conductive coupler 56 is interposed between the metal plate 55 and a surface of the central processing unit 21 in such a manner that the coupler 56 abuts them. In addition, a flexible heat conductive coupler 57 is provided between the metal plate 55 and the heat dissipation block 52. A metal plate 68 is thermally connected to the corresponding portion of the daughter board 20 through an electrically insulating heat conductive sheet 67.

A part of heat generated by the central processing unit 21 is conducted from the frame 54 to the metal plate 55 through the heat conductive sheet 67, the metal plate 68, and the daughter board 20. Another part of the heat is conducted to the metal plate 55 through the coupler 56. The heat is dissipated outside the case 11 through the heat conductive coupler 56, the heat dissipation block 52, and the heat dissipation plate 51.

Figure 10:
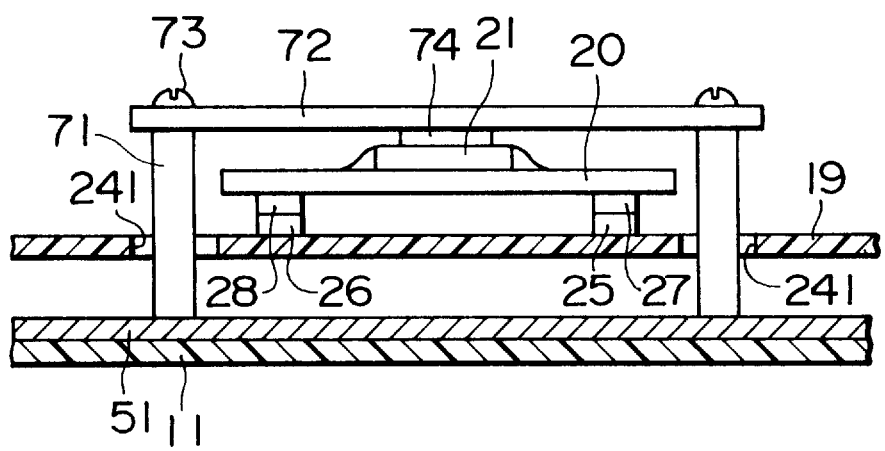

In the embodiment shown in FIG. 10, similar to the above embodiment, the daughter board 20 is mounted above the motherboard 19 through the connectors 25, 26, 27 and 28. The motherboard 19 is provided with a plurality of through holes 241 with small diameter, instead of the through hole 24 with large diameter for the heat dissipation block 52. Metal rods 71 extend from the heat dissipation plate 51 through these through holes 241. A metal plate 72 is held on the metal rods 71 with screws 73. A flexible heat conductive coupler 74 is interposed between the metal plate 72 and the central processing unit 21.

Heat of the central processing unit 21 is conducted to the metal plate 72 through the heat conductive coupler 74, and dissipated in a planar direction. The heat is dissipated outside through the metal rods 71, the heat dissipation plate 51, and the case 11.

Figure 11:
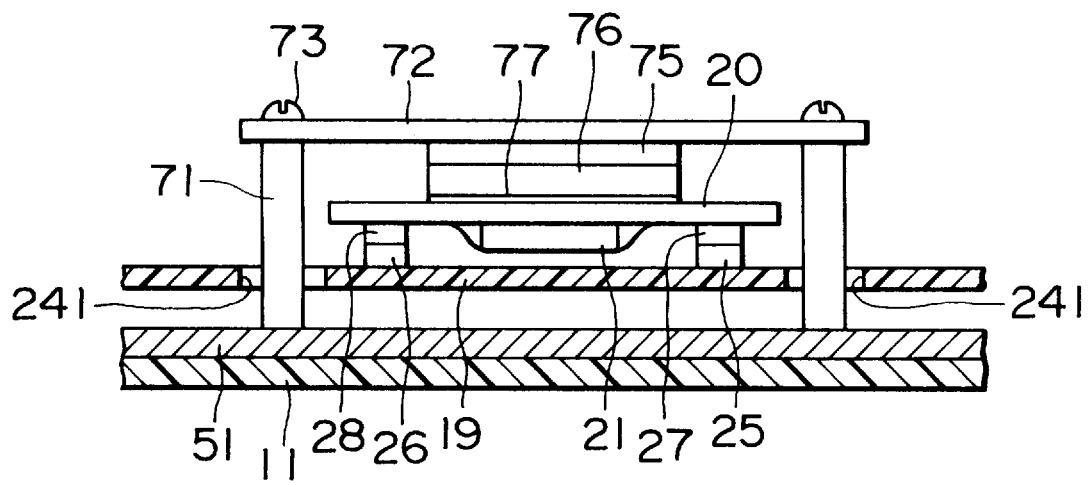

The arrangement of the embodiment shown in FIG. 11 is similar to that of the embodiment shown in FIG. 10. However, they are different from each other in whether the central processing unit 21 is displaced between the motherboard 19 and the daughter board 20. A metal plate 72 is thermally connected to the corresponding portion of the daughter board 20 through a flexible heat conductive coupler 75, a metal plate 76, and an electrically insulating heat conductive sheet 77.

Heat of the central processing unit 21 is conducted to the metal plate 72 through the daughter board 20, the heat conductive sheet 72, the metal plate 76 and the coupler 75, and dissipated there in a planar direction. The heat is dissipated outside through the metal rods 71, the heat dissipation plate 51, and the case 11.

Figure 12:
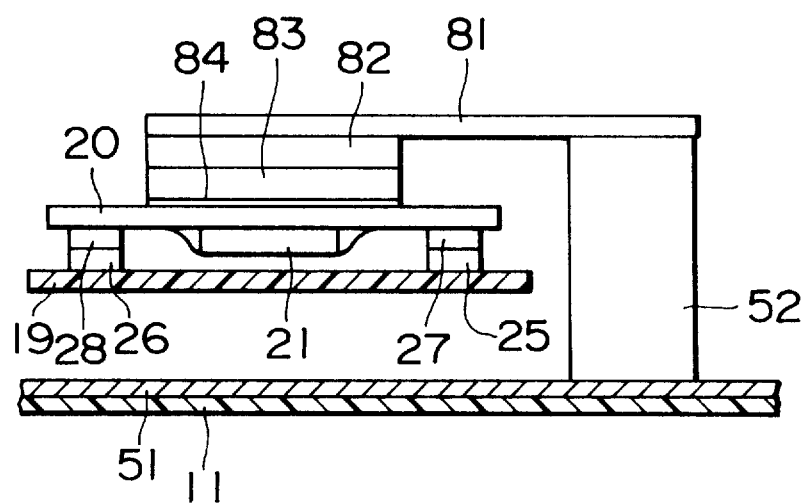

For heat dissipation from an electronic equipment in which the daughter board 20 is mounted on an edge portion of the motherboard 19, a heat dissipation structure shown in FIG. 12 can be applied. The daughter board 20 is mounted on the motherboard 19 through connectors 25, 26, 27 and 28 so that the central processing unit 21 is disposed between the motherboard 19 and the daughter board 20. One end portion of a metal plate 81 is thermally coupled to the corresponding portion of the dauther board 20 through a flexible heat conductive coupler 82, a metal plate 83, and an electrically insulating heat conductive sheet 84. The other end portion of the metal plate 81 is fixed to a heat dissipation block 52. The heat dissipation block 52 extends from the heat dissipation plate 51 outside the motherboard 19 and the duather board 20.

Heat of the central procesing unit 21 is conducted to the metal plate 781 thorugh the daughter board 20, the neat conductive sheet 84, the metal plate 83 and the coupler 82, and dissipatied there in planar direction. The heat is dissipated outside through the hat dissipation block 52, the heat dissipation polate 51, and the case 11.

Now, description is given to an embodiment where heat is dissipated through not only the case but also the keyboard.

Figure 13:
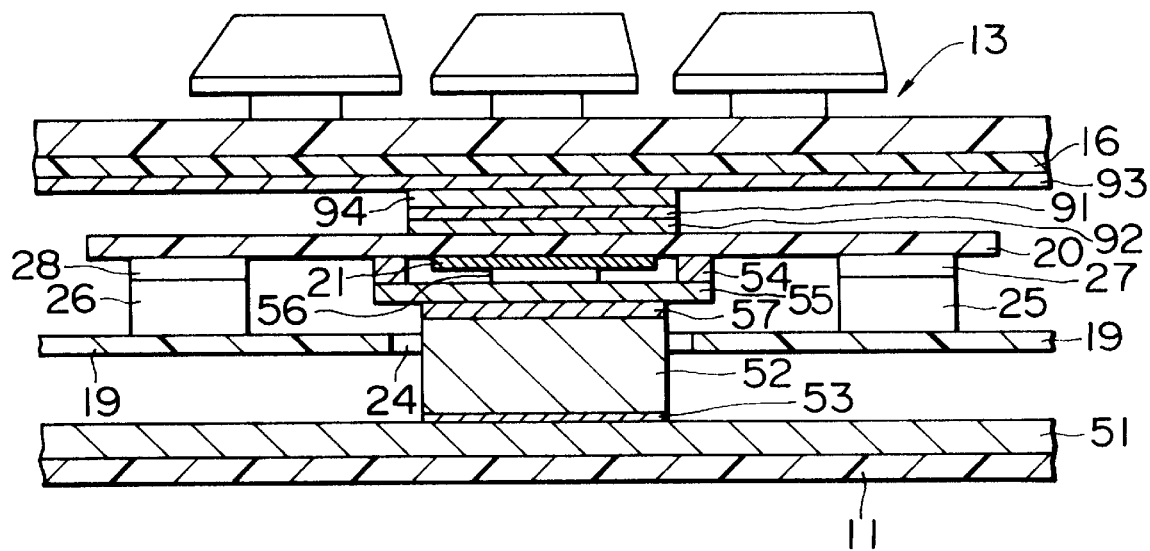
FIG. 13 is a fragmentary sectional view showing the heat dissipation structure according to another aspect of the present invention.
Figure 14:
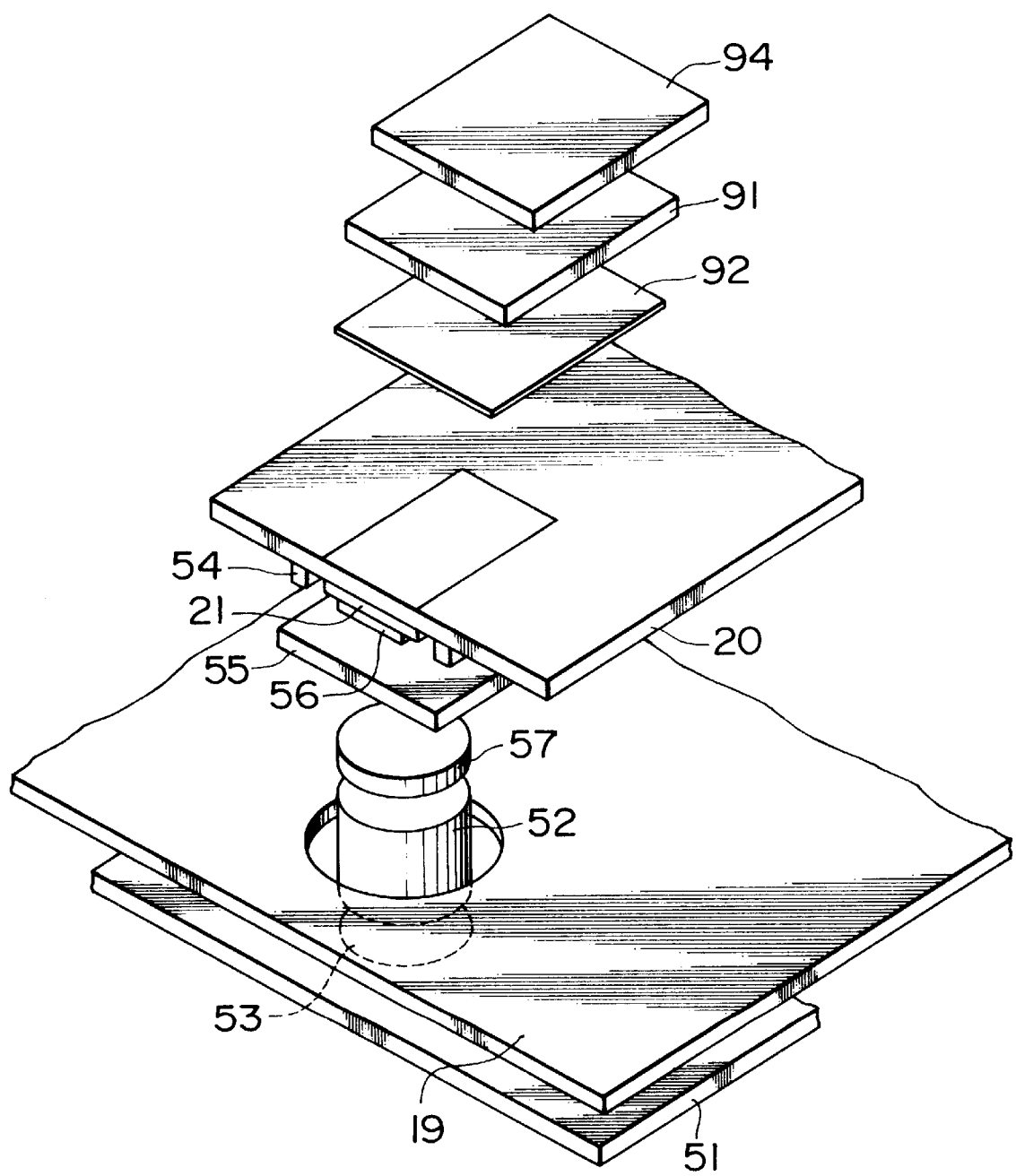
FIG. 14 is an exploded perspective view showing the structure of FIG. 13.

In the embodiment shown in FIGS. 13–14, a heat dissipation plate 51 made of a material with high heat conductivity such as aluminum or copper is installed on an inner floor of a case bottom 11. A motherboard 19 is held so that it is separated from a heat dissipation plate 51 by a predetermined distance.

A daughter board 20 is positioned between the motherboard 19 and a keyboard 13 so that a central processing unit 21 is disposed between the daughter board 20 and the motherboard 19 when connectors 25 and 26 are mated to connectors 27 and 28.

A heat dissipation block 52 is provided on the heat dissipation plate 51 through an adhesive heat conductive tape 53. The heat dissipation block 52 extends from the heat dissipation plate 51 through a through hole 24 formed in the motherboard 19.

The daughter board 20 is provided with an electrically insulating frame 54 surrounding the central processing unit 21. The frame 54 supports a metal plate 55. A flexible heat conductive coupler 56 is interposed between the metal plate 55 and a surface of the central processing unit 21 in such a manner that the coupler 56 abuts against them. Moreover, a flexible heat conductive coupler 57 is provided between the metal plate 55 and the heat dissipation block 52.

The keyboard 13 is supported by a keyboard frame 16.

Another heat dissipation block 91 is fixed on the corresponding portion of the daughter board 20 through a heat conductive tape 92. When the keyboard frame 16 is mounted on the bottomed case 11 together with another heat dissipation plate 93, the heat dissipation plate 93 and the heat dissipation block 91 are thermally coupled together through a heat conductive coupler 94 made of heat conductive elastomer. That is, when the keyboard frame 16 is assembled to the bottomed case 11, the heat conductive coupler 94 is compressed by the assembling force. The reaction force of the coupler 94 causes the heat dissipation block 91 to closely contact the corresponding portion of the daughter board 20 through the heat conductive tape 92, and the heat dissipation plate 93 to closely contact the keyboard frame 16. This establishes a thermal path between the corresponding portion of the daughter board 20 and the keyboard 13. When the keyboard frame 16 and the heat dissipation plate 93 are removed, and the connectors 27 and 28 are detached from the connectors 25 and 26, the daughter board or the central processing unit can be freely exchanged.

Figure 15:
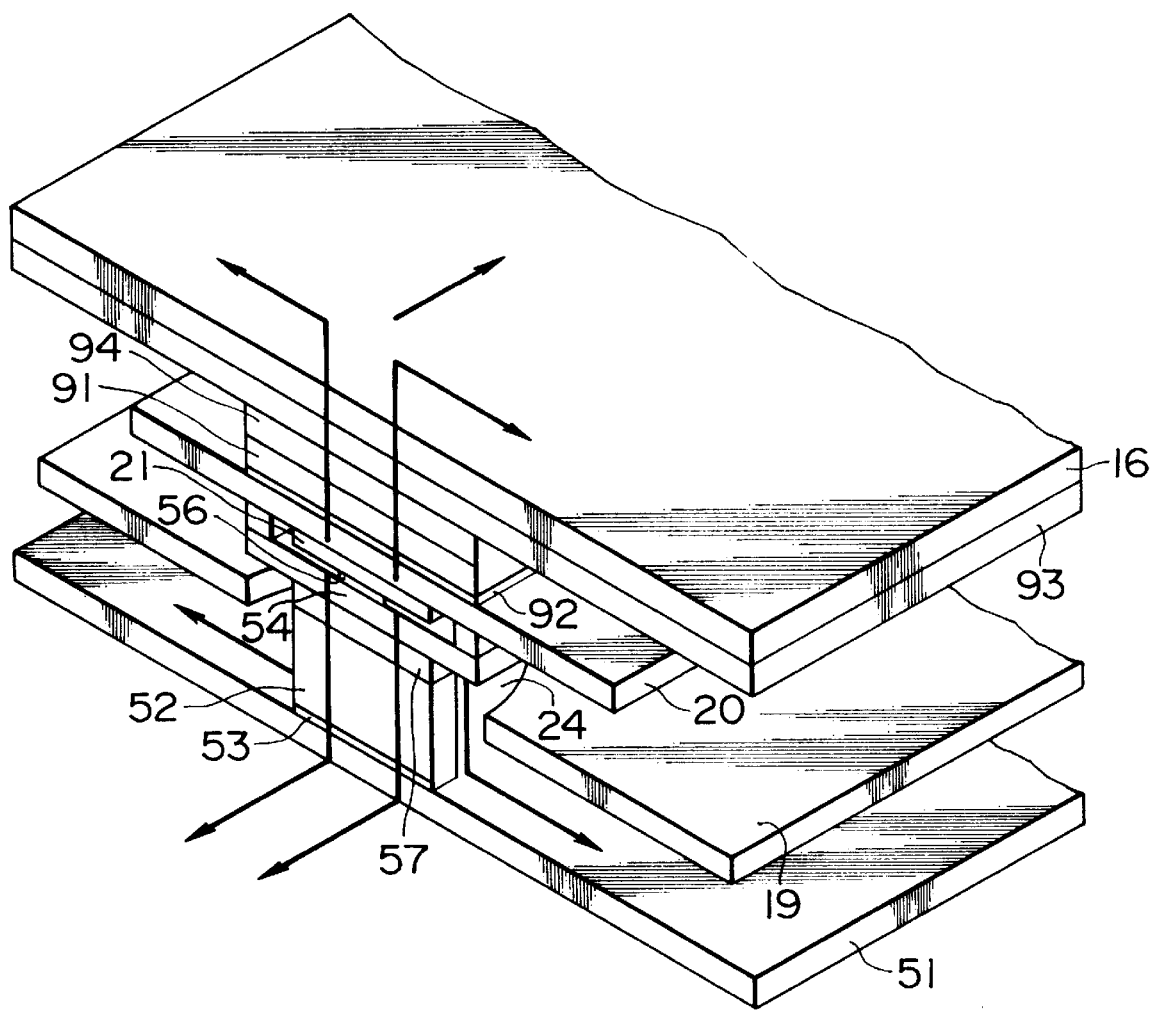
FIG. 15 is a perspective view showing the structure of FIG. 13.

Heat of the central processing unit 21 is conducted as indicated by arrows in FIG. 15. That is, a part of heat of the central processing unit 21 is conducted to the heat dissipation plate 51 through the coupler 56, the metal plate 55, the coupler 57, the heat dissipation block 52 and the tape 53. The heat diverges in the heat dissipation plate 51 in a planar direction, and dissipates outside through the case 11. Another part of heat of the central processing unit 21 is conducted to the heat dissipation plate 93 through the daughter board 20, the tape 92, the heat dissipation block 91 and the coupler 94. The heat dissipates in the heat dissipation plate 93 in a planar direction, and is dissipated outside through the keyboard frame 16 and the keyboard 13.

As shown in FIG. 16, a groove is formed in the heat dissipation plate 51, and a heat pipe 58 extends along the groove. One end of the heat pipe 58 is fixed to a portion corresponding to the heat dissipation block 52 by a metal holding plate 59. The holding plate 59 is flush with the heat dissipation plate 51. The heat dissipation block 52 is mounted on the holding plate 59 through the tape 53. Another end of the heat pipe 58 extends to an edge portion of the heat dissipation plate 51 remote from the daughter board 20. This arrangement provides more efficient heat dissipation.

Examples which are applied to a personal computer have been described in the above. However, it will be easily appreciated by those skilled in the art that the heat dissipation structure according to the present invention may be applied not only electronic equipment such as an information processing device using a central processing unit, but also to an electronic equipment for power supply.

What is claimed is:

1. A heat dissipation structure for an electronic equipment having a keyboard and a bottomed case which cooperate with each other to delimit a space therebetween, said heat dissipation structure comprising in said space:

a first heat dissipation plate disposed on a bottom of said bottomed case;

a first board disposed apart from said first heat dissipation plate by a predetermined distance;

a second board disposed in such a manner that said first board is positioned between said first heat dissipation plate and said second board, and said second board is interposed between said first board and said keyboard, said second board having a current consuming device mounted on a surface thereof facing said first board; and a first heat dissipation block assembly extending from said first heat dissipation plate through said first board and abutting onto a surface of said current consuming device on said second board.

2. A heat dissipation structure as set forth in claim 1, further comprising a second heat dissipation plate mounted on said keyboard and disposed in such a manner that said first and second boards are disposed between said first and second heat dissipation plates; and a second heat dissipation block assembly extending from said second heat dissipation plate and abutting a portion of said second board opposite to the surface thereof on which said current consuming device is mounted, which portion corresponds to said current consuming device.

3. A heat dissipation structure as set forth in claim 2, wherein said electronic equipment is an information processing apparatus, said current consuming device is a processing unit, said first heat dissipation block assembly is thermally connected to a bottom of a housing of said information processing apparatus, and said second heat dissipation block assembly is thermally connected to a keyboard of said information processing apparatus.

4. A heat dissipation structure as set forth in claim 2, wherein said first board includes an opening therethrough and said first heat dissipation block assembly extends through said opening of said first board without contacting said first board in a region of said opening.

5. A heat dissipation structure as set forth in claim 1, wherein said first heat dissipation block assembly comprises a heat dissipation block and a heat conductive interposed member through which said heat dissipation block is fixed on said first heat dissipation plate.

6. A heat dissipation structure as set forth in claim 5 further comprising a heat pipe one end portion of which is fixed to a portion of said first heat dissipation plate near the position where said heat dissipation block of said first heat dissipation block assembly is fixed, and the other end of which extends to an outer peripheral edge of said first heat dissipation plate.

7. A heat dissipation structure as set forth in claim 1, wherein said current consuming device is a processing unit or a circuit device.

8. A heat dissipation structure as set forth in claim 1, wherein said electronic equipment is a portable computer.

9. A heat dissipation structure as set forth in claim 1, wherein said first board includes an opening therethrough and said first heat dissipation block assembly extends through said opening of said first board without contacting said first board in a region of said opening.

10. A heat dissipation structure for an electronic equipment comprising:

a first heat dissipation plate;

a first board disposed apart from said first heat dissipation plate by a predetermined distance;

a second board disposed in such a manner that said first board is positioned between said first heat dissipation plate and said second board, and being mounted with a current consuming device thereon; and a heat dissipation block assembly extending from said first heat dissipation plate through said first board and abutting a surface of said device on said second board;

wherein said first heat dissipation block assembly comprises a heat dissipation block and a heat conductive interposed member through which said heat dissipation block is fixed on said first heat dissipation plate; and wherein said first heat dissipation block assembly further comprises a first metal plate fixed on said device on said second board, and a heat conductive coupler for coupling said metal plate and said heat dissipation block.

11. A heat dissipation structure as set forth in claim 10, wherein a second metal plate is fixed on said portion of the surface of said second board opposite to a surface thereof on which said device is mounted, which portion corresponds with said device.

12. A heat dissipation structure as set forth in claim 11, wherein said first and second metal plates are coupled together by a thermal path.

13. A heat dissipation structure as set forth in claim 12, wherein said thermal path includes a metal rod extending through said second board and fixing said first and second metal plates together.

14. A heat dissipation structure for an electronic equipment comprising:

a first heat dissipation plate;

a first board disposed apart from said first heat dissipation plate by a predetermined distance;

a second board disposed in such a manner that said first board is positioned between said first heat dissipation plate and said second board, and being mounted with a current consuming device thereon; and a heat dissipation block assembly extending from said first heat dissipation plate through said first board and abutting a surface of said device on said second board;

wherein said first heat dissipation block assembly comprises a heat dissipation block fixed on said first heat dissipation plate, a first metal plate connected to said device through a heat conductive interposed member, and a heat conductive coupler for connecting said first metal plate to said heat dissipation block.

* * * * *